United States Patent
Chauhan et al.

(10) Patent No.: US 12,131,799 B2
(45) Date of Patent: *Oct. 29, 2024

(54) TRIM/TEST INTERFACE FOR DEVICES WITH LOW PIN COUNT OR ANALOG OR NO-CONNECT PINS

(71) Applicant: TEXAS INSTRUMENTS INCORPORATED, Dallas, TX (US)

(72) Inventors: Rajat Chauhan, Karnataka (IN); Divya Kaur, Delhi (IN); Rishav Gupta, Punjab (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/203,806

(22) Filed: May 31, 2023

(65) Prior Publication Data
US 2023/0343375 A1 Oct. 26, 2023

Related U.S. Application Data

(63) Continuation of application No. 17/537,872, filed on Nov. 30, 2021, now Pat. No. 11,705,169.

(30) Foreign Application Priority Data

Dec. 23, 2020 (IN) .............................. 202041056137

(51) Int. Cl.
*G11C 7/10* (2006.01)
*H03K 19/007* (2006.01)

(52) U.S. Cl.
CPC ......... *G11C 7/1084* (2013.01); *H03K 19/007* (2013.01)

(58) Field of Classification Search
CPC ................................ G11C 7/10; G11C 7/1084
USPC ..................................................... 365/189.05
See application file for complete search history.

(56) References Cited

U.S. PATENT DOCUMENTS

| | | | | | |
|---|---|---|---|---|---|
| 5,563,526 A | * | 10/1996 | Hastings | .................... | H03F 3/72 326/37 |
| 8,547,135 B1 | * | 10/2013 | Yarlagadda | .......... | H03K 19/177 326/38 |
| 11,705,169 B2 | * | 7/2023 | Chauhan | .............. | G11C 29/028 365/189.05 |
| 2007/0070703 A1 | * | 3/2007 | Tran | ......................... | G11C 8/10 365/185.22 |

(Continued)

*Primary Examiner* — Muna A Techane
(74) *Attorney, Agent, or Firm* — Charles F. Koch; Frank D. Cimino

(57) ABSTRACT

A trim/test interface in a packaged integrated circuit device prevents high through-current between pins of the IC device and trim/test interface digital logic within the IC device using a floating-pin-tolerant always-on CMOS input buffer. The always-on buffer uses a coupling capacitor at its input to block signals at DC and a weak-latch feedback path to ensure that intermediate or floating inputs are provided through the buffer only at one of two digital levels (e.g., those provided by a ground pin GND and by a high supply voltage pin VDD). The described interfaces and methods provide for false-entry-free test mode activation for IC devices with a low pin count, where there are a limited number of pins to cover all test/trim functions, or in which only analog, no-connect, or failsafe pins are available for trim or test mode entry control or trim or test data input.

20 Claims, 5 Drawing Sheets

(56) References Cited

U.S. PATENT DOCUMENTS

2018/0038913 A1* 2/2018 Murthy .................. H01L 22/14
2020/0168287 A1* 5/2020 Kim .................. G01R 31/3187

* cited by examiner

SIX-PIN TEST INTERFACE ARCHITECTURE

TRIM/TEST INTERFACE FOR DEVICES WITH LOW PIN COUNT OR ANALOG OR NO-CONNECT PINS

CROSS-REFERENCE TO RELATED APPLICATION

This application is a Continuation of U.S. application Ser. No. 17/537,872 filed Nov. 30, 2021, which claims priority to Indian provisional patent application No. 202041056137, filed 23 Dec. 2020, which is hereby incorporated by reference.

TECHNICAL FIELD

This description relates generally to electronic circuits, and more particularly to a trim/test interface for devices with low pin count or analog or no-connect pins.

BACKGROUND

Trim and test are two aspects of post-fabrication interaction with an integrated circuit (IC) device that help to ensure proper operation of the device, and which may involve use of a special interface included in the device so as to provide the device with trim and test inputs and to access test outputs. After the fabricated IC device has been packaged in a molded-material enclosure with conductive (e.g., metal) pins, a trim interface can be used to trim the device. Trimming an IC device involves programming the device or otherwise adjusting subcomponents of the device so that the output of the device meets certain parameters or specification requirements, given certain inputs to the device. For example, trimming can include tailoring the binary values of trim bits stored in the device, either at fabrication time or at operation time, to calibrate the device to account for process shift (e.g., due to variances in fabrication materials or methods) or environmental shift (e.g., temperature shift) that may otherwise be evident in the device's output.

Similarly, a test interface can be used to conduct post-packaging testing on a packaged IC device to determine whether certain output parameters or specification requirements of the device are met. Such post-packaging testing is limited to use of the pins provided by the package, and cannot, without damage to the packaging, access other electrical nodes in the IC device beyond those provided by the packaging. A trim interface and a test interface can be combined as a trim/test interface.

A supply voltage supervisor (SVS) is a circuit that monitors a supply voltage provided to embedded controllers, serializers/deserializers, and other microcontroller systems for under-voltage or over-voltage conditions. Based on the SVS detecting an under-voltage or over-voltage condition, the SVS can reset an associated controller or other device and keep the controller or other device in the reset state as long as the aberrant voltage condition persists. SVS circuits can thus be used to protect circuitry such as a memory protection unit (MPU), dynamic random-access memory (DRAM), and other devices that can be damaged by high voltages or that operate incorrectly at low voltages.

SUMMARY

An example packaged IC device includes packaging enclosing an IC die. The packaging includes conductive pins including a first pin configured to receive analog input signals in a normal mode of the IC device and to receive a digital test mode entry clock signal as a key to entry of the IC device into a test mode in which the IC device is configured to receive test or trim inputs on one or more of the pins and to provide test outputs on the one or more of the pins or to calibrate the IC device by programming trim bit registers in a nonvolatile memory in the IC device. The IC die includes a power-on reset (POR) generator and a test interface architecture. The test interface architecture includes digital logic configured to transition the IC device from the normal mode to the test mode. The test interface architecture further includes a floating-pin-tolerant always-on complementary metal-oxide-semiconductor CMOS input buffer coupled at a first end to the first pin and at a second end to an input of the digital logic. The always-on CMOS input buffer can, for example, include a coupling capacitor coupled at a first end to an input of the always-on CMOS input buffer and at a second end to a first end of a feed-forward path of the always-on CMOS input buffer. The always-on CMOS input buffer can further include a feedback path coupled at a first end to a second end of the feed-forward path of the always-on CMOS input buffer and at a second end to the second end of the coupling capacitor. The feedback path can include a feedback impedance. The always-on CMOS input buffer further can further include a logic gate coupled at a first input of the logic gate to the second end of the feed-forward path, at a second input of the logic gate to a POR output of the POR generator, and at an output of the logic gate to the second end of the always-on CMOS input buffer.

In an example method of test mode enablement in an IC device, a power-on reset signal is asserted within the IC device. Digital logic in a trim/test interface within the IC device detects a specified number of cycles of a test mode entry clock provided via a first input buffer. The first input buffer is a floating-pin-tolerant always-on CMOS input buffer. The digital logic detects a secure sequence bit pattern provided via a second input buffer. The digital logic entering the IC device into the test mode in which the IC device is configured to be tested and/or trims of the IC device are configured to be adjusted.

An example IC device includes a first pin configured to receive an analog failsafe input in a normal mode of the IC device and to receive a digital test mode entry clock signal as a first key to enter a test mode of the IC device. The IC device further includes a second pin configured to provide a digital failsafe output in the normal mode and to receive and provide digital test input and output signals in the test mode. The IC device further includes digital logic configured to transition the IC device from the normal mode to the test mode. The IC device further includes a floating-pin-tolerant always-on CMOS input buffer coupled at a first end to the first pin and at a second end to an input of the digital logic. The always-on CMOS input buffer includes a coupling capacitor coupled at a first end to an input of the always-on CMOS input buffer and at a second end to a first end of a feed-forward path of the always-on CMOS input buffer. The always-on CMOS input buffer further includes a feedback path coupled at a first end to a second end of the feed-forward path of the always-on CMOS input buffer and at a second end to the second end of the coupling capacitor, the feedback path comprising a feedback resistor. The always-on CMOS input buffer further includes a logic gate coupled at a first input of the logic gate to the second end of the feed-forward path, at a second input of the logic gate to a POR output of a POR generator, and at an output of the logic gate to the second end of the always-on CMOS input buffer.

DETAILED DESCRIPTION

The present application describes a post-package trim interface and/or test interface for low-pin-count precision IC devices, or for IC devices of any pin count that provide only an analog pin and/or only no-connect pins as trim/test interface pins. A post-packaging trim/test interface that uses pin-only access can help eliminate post-package shift in trim values, and/or can help eliminate the need for a wafer-level probe from a production flow prior to packaging. Such an interface can provide quick debug access to test modes at a pin level, and thus can help improve debug turnaround times. For example, in an IC device in which a nonvolatile memory (NVM) is used to store trim bits or other information, a post-packaging external read margin (Ext RM) capability, such as may be provided by the interfaces and methods described herein, can check for NVM charge loss (memory signal weakness) incurred during packaging assembly. For example, wafer-level chip-scale packaging (WCSP) processes can have a polyimide (PI) layer bake step (e.g., at 350° C. for about 70 minutes) that can cause NVM charge loss, resetting a bit that was saved as a logical "1" to a logical "0", for example, or vice-versa. The NVM within the packaged IC device can be tested and/or trimmed post-packaging via a trim/test interface of the type described herein to ensure that the NVM is reliable and that any charge loss is corrected.

Figure 1A:
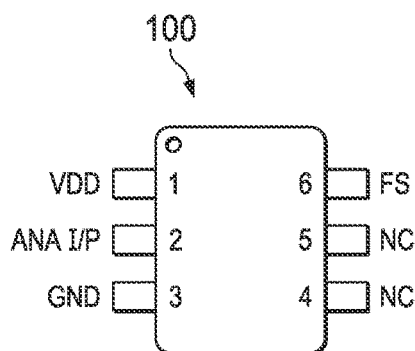
FIGS. 1A, 1B, 1C, and 1D are package diagrams of example packaged IC devices.

The package diagram of FIG. 1A shows the pin configuration for an example IC device 100 having six pins. The IC device 100 includes at least one IC die (e.g., cut from a processed semiconductor wafer upon which transistors and other electrical devices have been fabricated) and packaging that encloses the at least one IC die and couples bond pads of the IC die to conductive pins 1-6 for external connection. The packaging can include, in various examples, bonding wires and lead frames. The packaging can be made, for example, by a WCSP process involving a bake step. The IC device 100 can have a normal mode (a mode in which the device is connected and operated in its intended application) and a trim mode and/or a test mode, collectively referred to in this application as a "test mode", which should be understood to encompass any of a trim mode, a test mode, or a mode that allows both trimming and testing of the IC device 100. In any of these latter modes, the device may be, for example, coupled by its pins 1-6 to a tester, specialized equipment for testing and/or trimming the IC device 100. As used herein, "normal mode" should be considered to encompass any mode of operation of the IC device that is not the test mode. The pin labels at the periphery of FIG. 1A are the abbreviated names given to voltage rails (VDD, GND), signals provided to or from the IC device 100 in its normal mode of operation (ANA I/P, GND, FS), or no-connect (NC) designations applicable in normal mode.

Figure 2:
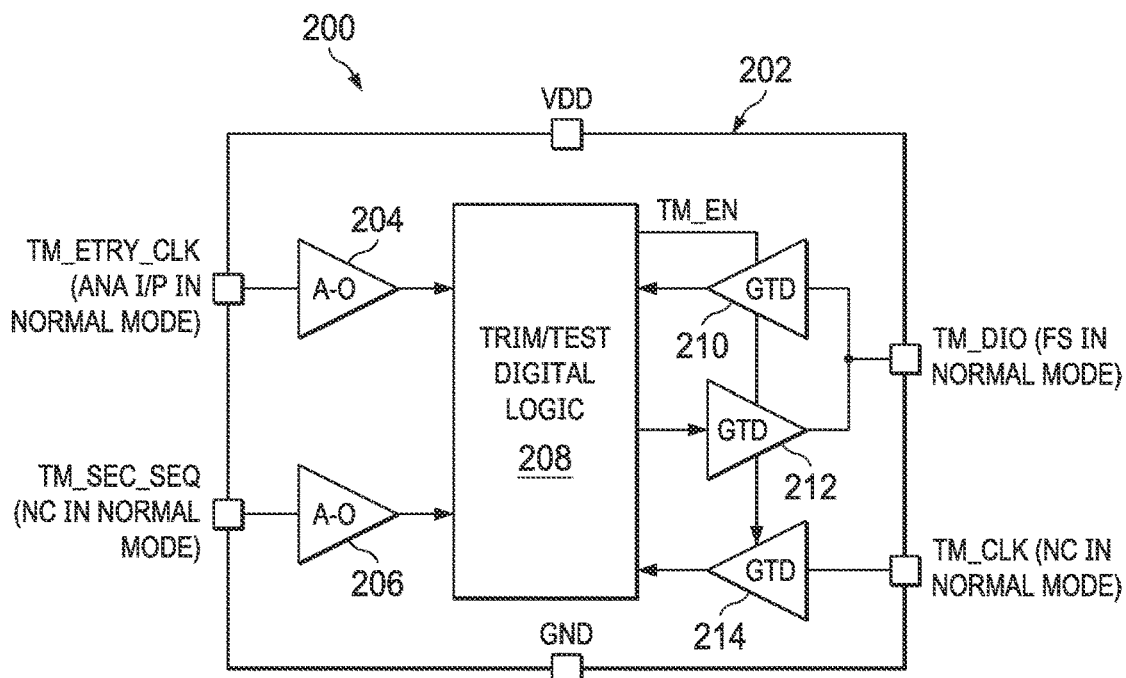
FIG. 2 is a block diagram of an example 6-pin trim/test interface in an IC device.

In the example IC device 100 of FIG. 1A, pin 1 is positive supply pin VDD. Pin 2 is analog failsafe input pin ANA I/P. Pin 3 is ground pin GND. Pins 4 and 5 are no-connect (NC) pins. Pin 6 is a digital failsafe output pin (FS). No-connect pins are those to which no useful input or output is externally connected to IC device 100 during normal-mode operation, and which may be left by the end user as connected to a positive or negative supply, connected to ground, connected to other voltage potentials, or left floating (unconnected). In general, however, no-connect pins may be connected to inputs or outputs internally within a packaged IC device, and in the illustrated example, the no-connect pins are connected internally within IC device 100, and can be employed to provide inputs and/or outputs during test mode, as shown in FIG. 2. A failsafe pin is a pin of an IC configured to reliably support a failsafe event, in which the voltage potential at the failsafe pin exceeds the supply voltage of the IC without damage to the IC. A failsafe input or failsafe output is an input or output, respectively, that makes use of a failsafe pin.

Figure 1B:
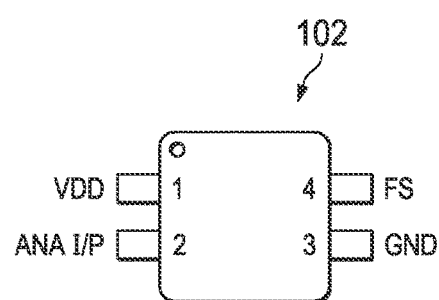

The package diagram of FIG. 1B shows the pin configuration for an example IC device 102 having only four pins. The IC device 102 is similar to IC device 100, but omits the two pins intended as no-connect pins in normal mode operation. In the example IC device 102 of FIG. 1B, pin 1 is positive supply pin VDD, pin 2 is analog failsafe input pin ANA I/P, pin 3 is ground pin GND, and pin 4 is a digital failsafe output pin (FS).

Figure 1C:
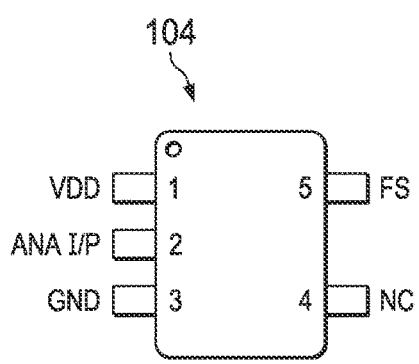
Figure 1D:
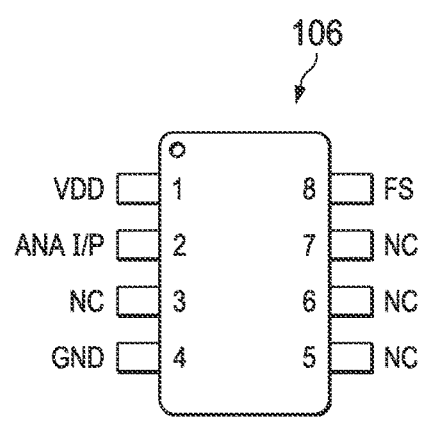

The package diagram of FIG. 1C shows the pin configuration for an example IC device 104 having only five pins. IC device 104 is similar to IC device 100, but omits one of the pins designated as a no-connect pin in normal mode operation. The package diagram of FIG. 1D shows the pin configuration for an example IC device 106 having only eight pins. IC device 106 is similar to IC device 100, but adds two additional pins designated as no-connect pins in normal mode operation. In other example IC devices similar to that of FIG. 1D, various of the no-connect pins can be provided as additional analog inputs and/or digital outputs. As examples, pins 2, 3, and 5 can be provided as aberrant supply voltage condition detection pins SENSE1, SENSE2, and SENSE3, and pins 6, 7, and 8 can be provided as reset outputs RESET1, RESET2, RESET3; pins 2 and 3 can be provided as aberrant supply voltage condition detection pins SENSE1 and SENSE2, pins 7 and 8 can be provided as reset outputs RESET1 and RESET2, and pins 5 and 6 can be provided as no-connect pins; or pins 2, 3, 5, and 6 can be provided as aberrant supply voltage condition detection pins SENSE1, SENSE2, SENSE3, and SENSE4, and pins 7 and 8 can be provided as reset outputs RESET1 and RESET2. In each of these examples, none of the pins are digital-only input pins configurable to receive a digital test mode entry signal, such as a test mode entry clock signal or a test mode secure sequence, as a test mode entry key. Other example package diagrams (not shown) may have greater than six pins, e.g., seven pins, eight pins, nine pins, ten pins, or more, with none of the pins being digital-only input pins configurable to receive a digital test mode entry signal, such as a test mode entry clock signal or a test mode secure sequence, as a test mode entry key.

FIG. 2 shows an example test interface architecture 200 of an IC device 202. IC device 202 can, for example, take the six-pin package form of IC device 100 shown in FIG. 1A. The IC device 202 may include other components not specifically shown in FIG. 2 to carry out its normal-mode and test-mode functions. A pin provided as an analog failsafe input pin (ANA FP) is designated in the test mode as a test mode entry clock pin TM_ETRY_CLK, used as a clock to enter test mode. A pin designated as a first no-connect (NC) pin in normal mode is designated in the test mode as a test mode secure sequence pin TM_SEC_SEQ, used to provide a secure sequence to enable entry into test mode. A pin provided as a digital failsafe output pin (FS) in normal mode is designated in the test mode as a test mode data input/output pin TM_DIO. A pin designated as a second no-connect (NC) pin in normal mode is designated in the test mode as a test mode clock pin TM_CLK. The positive supply pin VDD and the ground pin GND have the same function in both normal mode and test mode. In the example test interface architecture 200 of FIG. 2, all test-mode signals provided on or output by the test mode pins (TM_DIO, TM_CLK, TM_ETRY_CLK, TM_SEC_SEQ) are digital signals.

The example test interface architecture 200 of FIG. 2 can be configured such that one or more conditions, or "keys", must first be met before the IC device 202 enters into test mode. For example, there can be two conditions, which can be as follows. The first condition can be that a specified number of voltage cycles be provided on the test mode entry clock pin TM_ETRY_CLK in a given frequency range. The second condition can be that a specified digital bit pattern sequence be provided on the test mode secure sequence pin TM_SEC_SEQ. Once the keys are passed, as checked by digital logic 208, the test mode enable signal TM_EN goes high, thus enabling the gated complementary metal-oxide-semiconductor (CMOS) buffers 210, 212, and 214 coupled to the test mode data input/output pin TM_DIO and the test mode clock pin TM_CLK.

In an end-user application during which the IC device 202 is expected to operate in normal mode, a pin designated as no-connect (NC) can be coupled, on the outside of device 202, to a positive or negative supply, to ground, to other voltage potentials, or to nothing (left floating), all without endangering a false entry into test mode. By contrast to gated buffers 210, 212, and 214, labeled "GTD", the two always-on (undisableable) buffers 204, 206, labeled "A-O" and respectively coupled to the test mode entry clock pin TM_ETRY_CLK and the test mode secure sequence pin TM_SEC_SEQ, do not have any gating in the example test interface architecture 200 of FIG. 2. Thus, signals provided on the test mode entry clock pin TM_ETRY_CLK and the test mode secure sequence pin TM_SEC_SEQ are unconditionally conveyed through the always-on buffers 204, 206 to the trim/test digital logic 208. However, in normal mode, signals provided on the analog failsafe input pin ANA/IP (designated TM_ETRY_CLK in test mode), the digital failsafe output pin FS (designated TM_DIO in test mode) and either of the no-connect pins (designated TM_SEC_SEQ and TM_CLK in test mode) can have intermediate voltages that can undesirably cause high through-current through any of the associated buffers 204, 206, 210, 212, 214. High through-current is undesirable both for its power waste consequences and because it can cause circuit unreliability if the through-current exceeds rated current limits of the circuit components. Through-current in gated buffers 210, 212, and 214 on the TM_DIO and TM_CLK pins can be managed by disabling them during normal mode using test mode enable signal TM_EN. This disabling is possible because buffers 210, 212, and 214 are gated buffers each having an enable input controlled by the test mode enable signal TM_EN. Any disabling of the always-on buffers 204, 206 on the TM_ETRY_CLK and TM_SEC_SEQ pins, on the other hand, would undesirably prevent them from conveying key signals on the TM_ETRY_CLK and TM_SEC_SEQ pins to the trim/test digital logic 208 that would transfer the IP device 202 from normal mode to trim and/or test mode. To avoid through-current through the undisableable always-on buffers 204, 206, these always-on buffers can, for example, each be implemented as a floating-pin-tolerant always-on CMOS input buffer.

Figure 3:
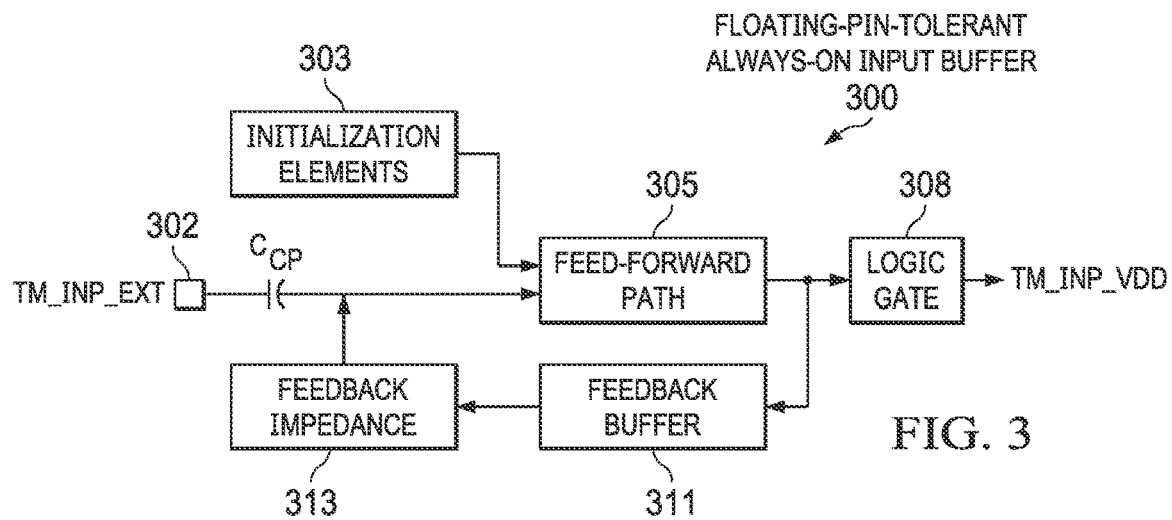
FIG. 3 is a block diagram of an example floating-pin-tolerant always-on CMOS input buffer.
Figure 4:
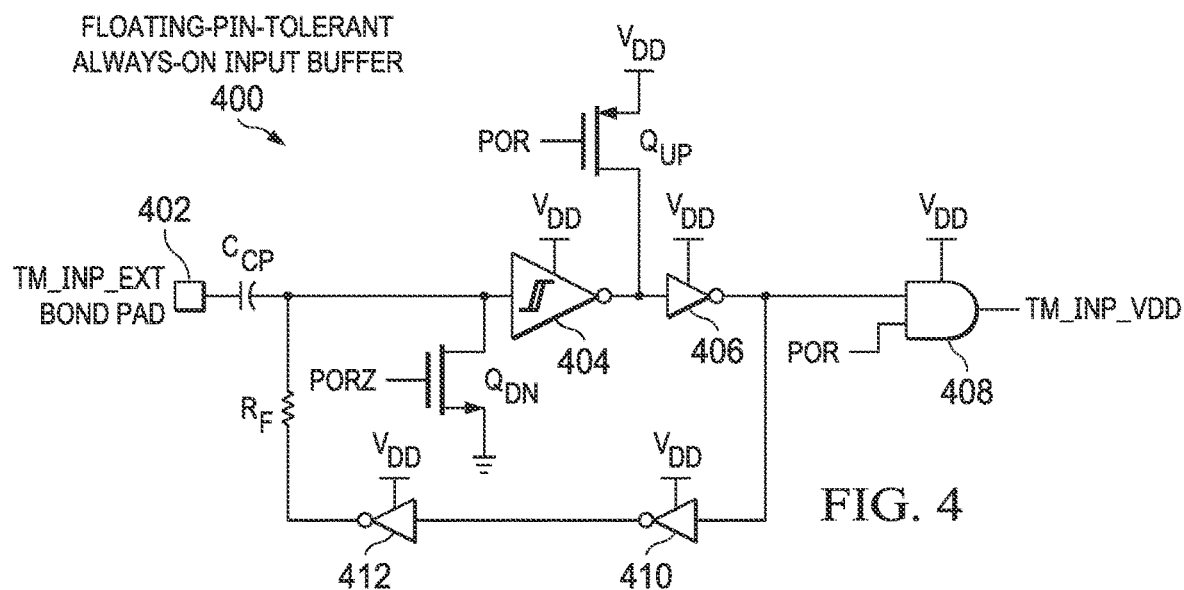
FIGS. 4 and 5 are circuit schematic diagrams of example floating-pin-tolerant always-on CMOS input buffers.
Figure 5:
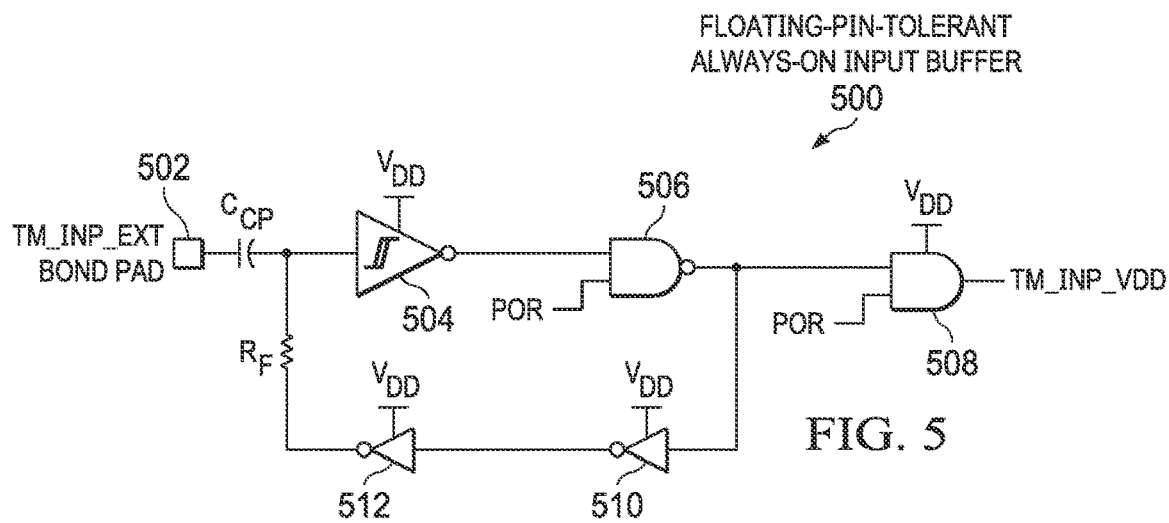

FIG. 3 shows an example floating-pin-tolerant always-on CMOS input buffer 300 that can be used to implement always-on buffers 204, 206 in the example test interface architecture 200 of FIG. 2. For example, bond pad 302 can be coupled to any external test mode input pin TM_INP_EXT, such as either of the test mode entry clock or test mode secure sequence pins TM_ETRY_CLK, TM_SEC_SEQ shown in FIG. 2. More generally, outside of the buffer 300, bond pad 302 can also be coupled to any analog, no-connect, or failsafe pin. Within the example buffer 300, the bond pad 302 is coupled to a first end of coupling capacitor $C_{CP}$. The second end of coupling capacitor $C_{CP}$ is coupled to a first end of a feed-forward path 305 that can, for example, include a Schmitt inverter and a feed-forward inverter in series with each other (as shown in FIG. 4), or a Schmitt inverter and an inverting logic gate (e.g., an inverting AND gate) in series with each other (as shown in FIG. 5). The second end of the coupling capacitor $C_{CP}$ is also coupled to a second end of a weak feedback path that includes a feedback buffer 311 and feedback impedance 313. The feedback buffer 311 can comprise a single noninverting buffer or can comprise two inverting buffers in series with each other, as shown in FIGS. 4 and 5. The feedback impedance 313 can comprise a feedback resistance (e.g., resistor RF shown in FIGS. 4 and 5) or a weak current source of a current value that accounts for the inherent delay in the buffer circuit 300. The coupling capacitor $C_{CP}$ and the feedback impedance form an RC system with an RC constant that determines the acceptable slew rate at the input of the buffer 300 as provided at bond pad 302. The range of values of the RC constant of this RC system, in units of time, depends on the response time of the feedback path in the buffer 300, the parasitic capacitance at the input of the buffer 300, and the slew rate of the corresponding input signal used to enter test mode (e.g., the test mode entry clock or the test mode secure sequence) as provided to the buffer 300. If the slew rate of the corresponding test mode input signal is smaller (if its ramp rate is faster), the RC time constant can be smaller, and vice versa. As an example, feedback impedance 313 can be provided by a resistor of a value between about 100 kΩ and about 10 MΩ, e.g., about 1 MΩ, and the coupling capacitance of the coupling capacitor $C_{CP}$ can be of a value between about 100 nF and about 10 pF, e.g., about 1 pF. With an RC constant of 1 MΩ-pF, the buffer 300 can accommodate an input ramp rate of greater than about 1 V/ρs.

Coupling capacitor $C_{CP}$ blocks the DC level at bond pad 302, such that any DC voltage at bond pad 302 is blocked and not passed on to the remainder of the buffer circuit 300, even if the voltage at bond bad 302 is at an intermediate level between ground and the supply voltage VDD, which may be at or near voltages assigned as representing a logical "0" and a logical "1" within the IC device in which buffer 300 is incorporated. Buffer 300 is therefore not level-sensitive when the IC device, in which buffer 300 is incorporated, is in normal operation. The weak feedback path at the lower portion of FIG. 3, including the feedback buffer 311 and the feedback impedance 313, allows the buffer 300 to define its input state in the absence of any input from outside of the buffer 300 via bond bad 302. Irrespective of the voltage level at bond pad 302, the weak feedback path (a latch) guarantees that the input to the feed-forward path 305 will be at either ground (0 V) or the supply voltage VDD. Buffer 300 thereby ensures that no through-current flows through the buffer 300 for a floating or intermediate input voltage at bond pad 300, as may be the case during normal operation of the IC device in which the buffer 300 is included. A second end of the feed-forward path can be provided, via a first input of logic gate 308, at the output of the buffer 300 as the buffer output TM_INP_VDD, which can be coupled to an input of the trim/test digital logic 208 of FIG. 2, for example. The second end of the feed-forward path is also coupled to the first end of the weak feedback path.

Initialization elements 303 can initialize the feed-forward path 305. As one example, the IC device's internal power-on-reset (POR) generator (not shown) can define the power-up state via a digital POR signal that can be provided to the gate of pull-up initialization p-type metal-oxide-semiconductor (PMOS) field-effect transistor (FET) $Q_{UP}$ (shown in the example of FIG. 4). The POR signal can generally be used throughout the IC device to inform the components of the IC device that all of the circuits in the IC device are prepared to function, and thus prevents premature provision of the output signal TM_INP_VDD of the buffer 300 to the digital logic 208. The logical complement of the POR signal, PORZ, can be provided to the gate of pull-down initialization n-type metal-oxide-semiconductor (NMOS) FET $Q_{DN}$ (shown in the example of FIG. 4). As another example, the POR signal can be provided to the input of an inverting AND (NAND) gate 506 in series with a Schmitt buffer 504 in the feed-forward path 305 (as shown in the example of FIG. 5). The weak latch feedback path is defined to a definite state on system start-up by the POR signal, initializing the value of the buffer's output signal TM_INP_VDD even in the absence of any input from outside the buffer via bond pad 302. The POR signal can also be provided to a second input of logic gate 308 at the output of the buffer 300. This second input of logic gate 308 is not shown in FIG. 3, but is shown in the examples of FIGS. 4 and 5, in which logic gate 308 is implemented as AND gate 408 or 508, respectively.

In the presence of a non-floating, non-intermediate external input at bond pad 302, the feedback path is weak enough to let the external input dominate and thus to be passed through to the output as signal TM_INP_VDD. As noted above, the values of the coupling capacitor Cu and the feedback resistor RF define the slew that can be provided at the buffer input 302. Lower capacitance and resistance values at these components allow for a very fast transitions at the input.

FIG. 4 shows an example floating-pin-tolerant always-on CMOS input buffer 400 that can be used to implement always-on buffers 204, 206 in the example test interface architecture 200 of FIG. 2. The description given above with regard to the more general example of buffer 300 in FIG. 3 applies to the example of FIG. 4 with regard to the inputs and outputs and the general functioning of the buffer 400. Bond pad 402 can be coupled to any external test mode input pin TM_INP_EXT, such as either of the test mode entry clock or test mode secure sequence pins TM_ETRY_CLK, TM_SEC_SEQ shown in FIG. 2. More generally, outside of the buffer 400, bond pad 402 can also be coupled to any analog, no-connect, or failsafe pin. Bond pad 402 is coupled to a first end of coupling capacitor Cu. The second end of coupling capacitor $C_{CP}$ is coupled to a first end of a feed-forward path that includes Schmitt inverter 404 and feed-forward inverter 406, and to a second end of a weak feedback path (lower portion of FIG. 4) that includes first and second feedback inverters 410, 412 and feedback resistor RF. The coupling capacitor Cu and the feedback resistor RF form an RC system with an RC constant that determines the acceptable slew rate at the input of the buffer 400 as provided at bond pad 402.

Irrespective of the voltage level at bond pad 402, the weak feedback path (a latch) guarantees that the input to the Schmitt inverter 404 will be at either ground (0 V) or the supply voltage VDD. Buffer 400 thereby ensures that no through-current flows through the buffer 400 for a floating or intermediate input voltage at bond pad 400, as may be the case during normal operation of the IC device in which the buffer 400 is included. A second end of the feed-forward path can be provided, via a first input of AND gate 408, at the output of the buffer 400 as the buffer output TM_INP_VDD, which can be coupled to an input of the trim/test digital logic 208 of FIG. 2, for example. The second end of the feed-forward path is also coupled to the first end of the weak feedback path.

The IC device's internal POR generator (not shown) can define the power-up state via a digital POR signal that is provided to the gate of pull-up initialization PMOS FET $Q_{UP}$ and to a second input of AND gate 408 at the output of the buffer 400. The logical complement of the POR signal, PORZ, is provided to the gate of pull-down initialization NMOS FET $Q_{DN}$. The weak latch feedback path is defined to a definite state on system start-up by the POR signal, initializing the value of the buffer's output signal TM_INP_VDD even in the absence of any input from outside the buffer via bond pad 402.

FIG. 5 shows another example floating-pin-tolerant always-on CMOS input buffer 500 that can be used to implement always-on buffers 204, 206 in the example test interface architecture 200 of FIG. 2. The description given above with regard to the more general example of buffer 300 in FIG. 3 applies to the example of FIG. 5 with regard to the inputs and outputs and the general functioning of the buffer 500. Bond pad 502 is coupled to a first end of coupling capacitor $C_{CP}$. The second end of coupling capacitor $C_{CP}$ is coupled to a first end of a feed-forward path that includes Schmitt inverter 504 and NAND gate 506, and to a second end of a weak feedback path (lower portion of FIG. 5) that includes first and second feedback inverters 510, 512 and feedback resistor RF. The coupling capacitor $C_{CP}$ and the feedback resistor RF form an RC system with an RC constant that determines the acceptable slew rate at the input of the buffer 500 as provided at bond pad 502.

Irrespective of the voltage level at bond pad 502, the weak feedback path (a latch) guarantees that the input to the Schmitt inverter 504 will be at either ground (0 V) or the supply voltage VDD. Buffer 500 thereby ensures that no through-current flows through the buffer 300 for a floating or intermediate input voltage at bond pad 300, as may be the case during normal operation of the IC device in which the buffer 500 is included. A second end of the feed-forward path can be provided, via a first input of AND gate 508, at the output of the buffer 500 as the buffer output TM_INP_VDD, which can be coupled to an input of the trim/test digital logic 208 of FIG. 2, for example. The second end of the feed-forward path is also coupled to the first end of the weak feedback path.

The IC device's internal POR generator (not shown) can define the power-up state via a digital POR signal that is provided to a second input of NAND gate 506 and to a second input of AND gate 508 at the output of the buffer 500. The weak latch feedback path is defined to a definite state on system start-up by the POR signal, initializing the value of the buffer's output signal TM_INP_VDD even in the absence of any input from outside the buffer via bond pad 502.

Figure 6:
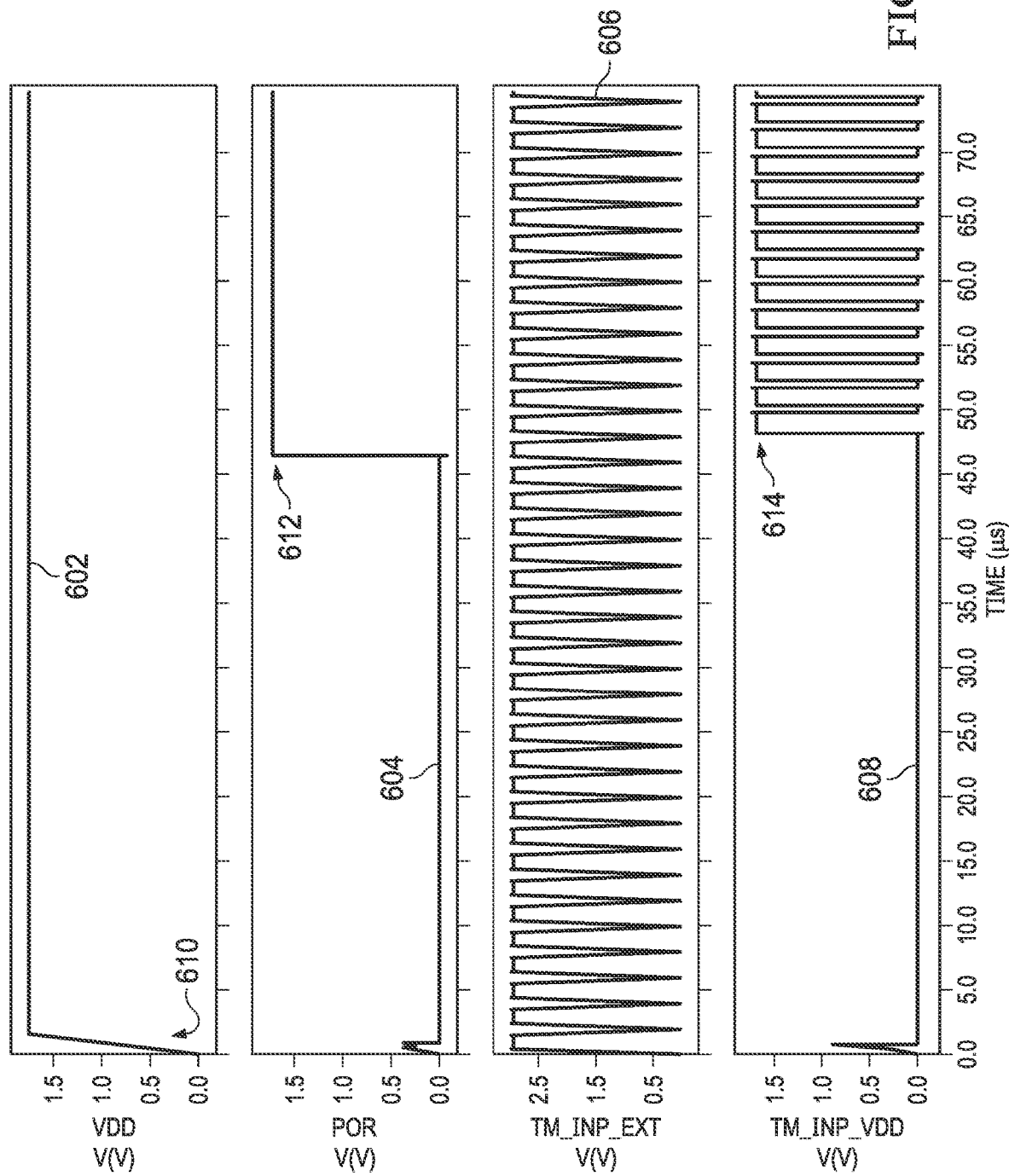
FIG. 6 is a timing diagram of an example operation of the floating-pin-tolerant always-on CMOS input buffer of FIG. 3.

The timing diagram of FIG. 6 shows an example operation of a floating-pin-tolerant always-on CMOS input buffer like any of buffers 300, 400, or 500 shown in FIG. 3, 4, or 5. The power-up turn-on of the supply voltage VDD is illustrated as rise 610 in trace 602 of FIG. 6. The POR signal is illustrated as trace 406 in FIG. 6. The test mode entry clock signal TM_ETRY_CLK or the test mode secure sequence signal TM_SEC_SEQ can be applied from the tester to the buffer 300, 400, or 500 as the external test mode input signal TM_INP_EXT, shown as trace 606 in FIG. 6, with a defined rise/fall slew-rate. Because this buffer input signal is an AC signal with a definite CdV/dt slope, it is capable of traversing the coupling capacitor Cu and will pass through to the output, provided the enabling of the POR signal 604 at output logic gate 308, 408, or 508. As shown in FIG. 6, prior to the POR signal 604 going high 612, the buffer output signal TM_INP_VDD, illustrated as trace 608, remains low. After the POR signal 604 goes high 612, at 614, the buffer output signal 608 takes on the digital form and frequency of the buffer input signal 606. When, for example, buffer 204 of FIG. 2 is implemented using any of buffers 300, 400, or 500 of FIG. 3, 4, or 5, the output signal 608 conveys the test mode entry clock signal TM_ETRY_CLK to the digital logic 208 in FIG. 2, which can in turn detect that the required number of test mode entry clock cycles have been provided as a first key to entering test mode. When, for example, buffer 206 of FIG. 2 is implemented using any of buffers 300, 400, or 500 of FIG. 3, 4, or 5, the output signal 608 conveys the test mode secure sequence signal TM_SEC_SEQ to the digital logic 208 in FIG. 2, which can in turn detect that the secure sequence bit pattern has been provided as a second key to entering test mode. Once both keys have been provided, the IC device 202 is taken out of normal mode and placed in test mode, bringing signal TM_EN high, enabling buffers 210, 212, and 214, and permitting test and/or trim inputs and/or outputs to be provided via the TM_DIO pin shown in FIG. 2. In the normal mode of the IC device 202, the buffer 300, 400, or 500 does not allow floating or intermediate voltages provided at bond pad 302, 402, or 502 to pass through to the output TM_INP_VDD.

The IC device in which the interfaces and methods of the present application may be implemented can be, in some examples, an SVS. SVS products having between four and six pins (inclusive) generally have at least a supply voltage pin VDD, a ground pin GND, an analog failsafe input SENSE, and a digital failsafe output pin (RESET). SVS products with a greater number of pins than four may also have one or more pins designated as no-connect (NC) in normal mode. The interfaces and methods of the present application can also be implemented in SVS devices and other IC devices having a greater number of pins than six, e.g., seven or eight pins, as may be found, for example, in multi-channel SVS devices. In SVS devices having eight pins, for example, additional analog failsafe inputs and additional digital failsafe outputs may be among the functions provided on the additional pins (e.g., on pins designated SENSE1, SENSE2, RESET1, RESET2, RESET3), to provide multi-channel supply voltage supervision functionality.

For a five-pin IC device, as in the example of FIG. 1C, the TM_CLK function shown in FIG. 2 can be merged with one of TM_ETRY_CLK or TM_SEC_SEQ functions, such that a TM_CLK signal can be made to share the same pin as either the TM_ETRY_CLK signal or the TM_SEC_SEQ signal, thereby reducing the number of needed pins from six (as shown in FIG. 2) to five. For a four-pin IC device, such as shown in FIG. 1B, as an example, the test mode clock function can be merged with the test mode entry clock function and the test mode secure sequence function can be merged with the test mode data input/output function, such that a test mode clock signal TM_CLK can be made to share the same pin as the test mode entry clock signal TM_ETRY_CLK, and a test mode secure sequence signal TM_SEC_SEQ can share the same pin as the test mode data input/output signal TM_DIO. For example, a combined TM_CLK/TM_ETRY_CLK pin can initially serve to deliver the test mode entry clock signal TM_ETRY_CLK, and once the test mode entry clock key has been passed, the test mode data input path can be enabled (e.g., temporarily enabled according to a timeout) to permit entry of the test mode secure sequence key. Based on the test mode secure sequence bit pattern being accepted, the test mode data input/output path can be enabled more persistently (e.g., until the IC device exits test mode, e.g., by virtue of being power-reset).

Figure 7:
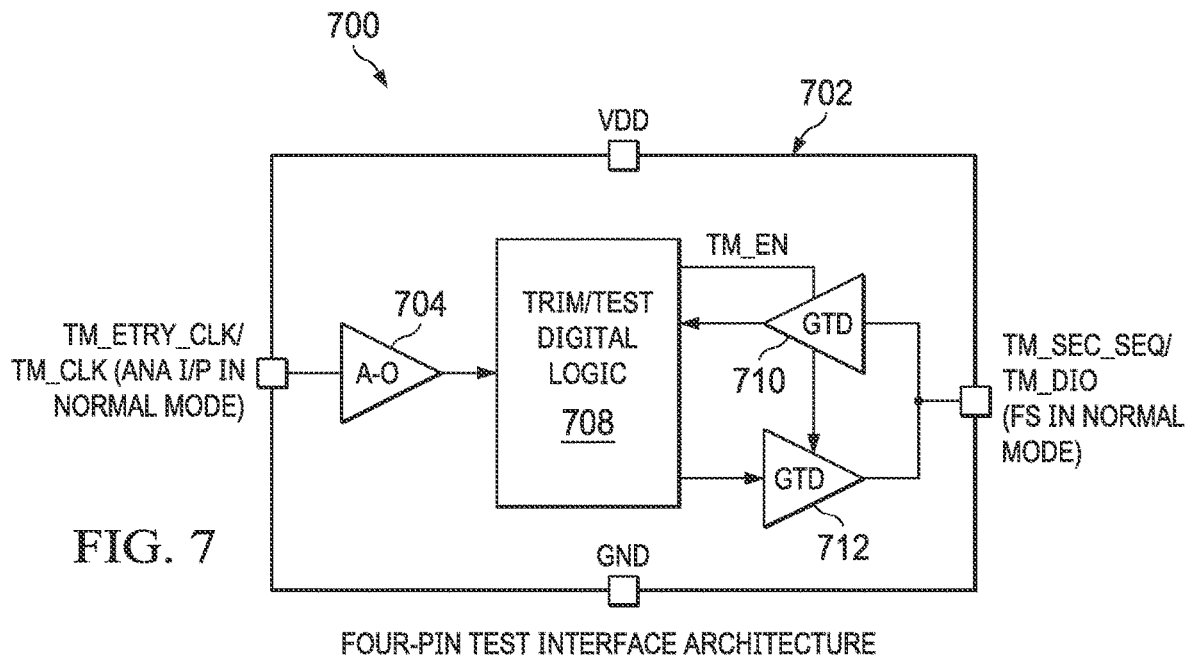
FIGS. 7 and 8 are block diagrams of example 4-pin trim/test interfaces.
Figure 8:
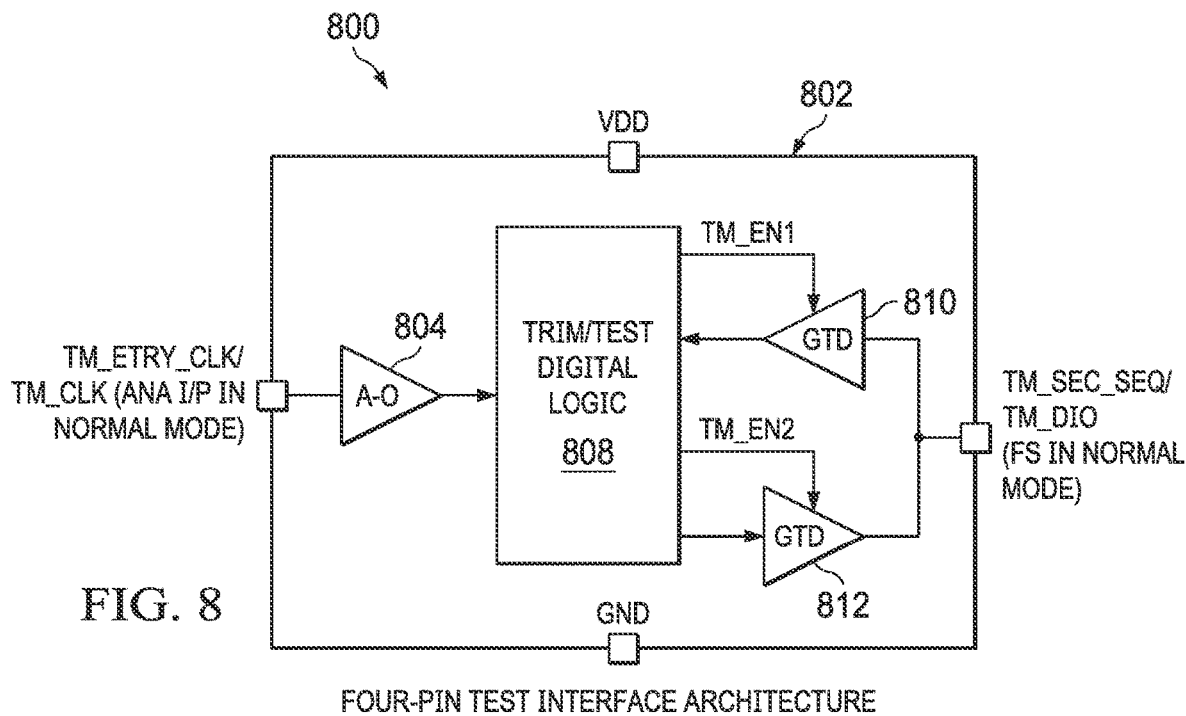

FIGS. 7 and 8 show examples of four-pin test interface architectures 700, 800 that are each like architecture 200 of FIG. 2, but which may be implemented in an IC device having only four pins rather than six, such as IC device 102 shown in FIG. 1B, in accordance with the description above. In architecture 700 of FIG. 7, within the IC device 702, an always-on input buffer 704, which can be implemented, for example, using the floating-pin-tolerant always-on CMOS input buffer 300, 400, or 500 of FIG. 3, 4, or 5, can initially provide the test mode entry clock TM_ETRY_CLK as a first key to trim/test digital logic 708. The digital logic 708 having accepted the first key, the digital logic 708 can enable (e.g., temporarily enable according to a timeout) the gated input/output buffers 710, 712 by asserting a test mode enable signal TM_EN to permit receipt of the second key via the test mode secure sequence signal TM_SEC_SEQ. The digital logic 708 having also accepted the second key and placed the IC device 702 in test mode, the digital logic 708 can maintain the test mode enable signal TM_EN more persistently (e.g., by indefinitely extending the timeout or removing the timeout condition) to retain the IC device 702 in test mode until the device is deactivated or returned to normal mode, e.g., by virtue of being power-reset. While in test mode, the test mode clock signal TM_CLK is provided via the same pin earlier used to supply the test mode entry clock signal TM_ETRY_CLK, through the always-on input buffer 704, and the test mode digital input and output signal TM_DIO is provided via the same pin earlier used to accept the secure sequence bit pattern through test mode secure sequence signal TM_SEC_SEQ.

Architecture 800 of FIG. 8 is like architecture 700 of FIG. 7, except that trim/test digital logic 808 is configured to provide the test mode enable signal as two different signals TM_EN1 and TM_EN2 to each of the input gated buffer 810 and the output gated buffer 812 separately. Within the IC device 802, an always-on input buffer 804, which can be implemented, for example, using the floating-pin-tolerant always-on CMOS input buffer 300, 400, or 500 of FIG. 3, 4, or 5, can initially provide the test mode entry clock TM_ETRY_CLK as a first key to trim/test digital logic 808. The digital logic 808 having accepted the first key, the digital logic 808 can enable (e.g., temporarily enable according to a timeout) the gated input buffer 810 by asserting a first test mode enable signal TM_EN1 to permit receipt of the second key via the test mode secure sequence signal TM_SEC_SEQ. The digital logic 808 having also accepted the second key and placed the IC device 802 in test mode, the digital logic 808 can both (1) maintain the first test mode enable signal TM_EN1 more persistently (e.g., by indefinitely extending the timeout or removing the timeout condition) to retain the IC device 802 in test mode until the device is deactivated or returned to normal mode, e.g., by virtue of being power-reset, and (2) assert the second test mode enable signal TM_EN2 to enable the output gated buffer 812 to permit test mode output signals TM_DIO to be passed via the corresponding pin. While in test mode, the test mode clock signal TM_CLK is provided via the same pin earlier used to supply the test mode entry clock signal TM_ETRY_CLK, through the always-on input buffer 804, and the test mode digital input and output signal TM_DIO is provided via the same pin earlier used to accept the secure sequence bit pattern through test mode secure sequence signal TM_SEC_SEQ.

Figure 9:
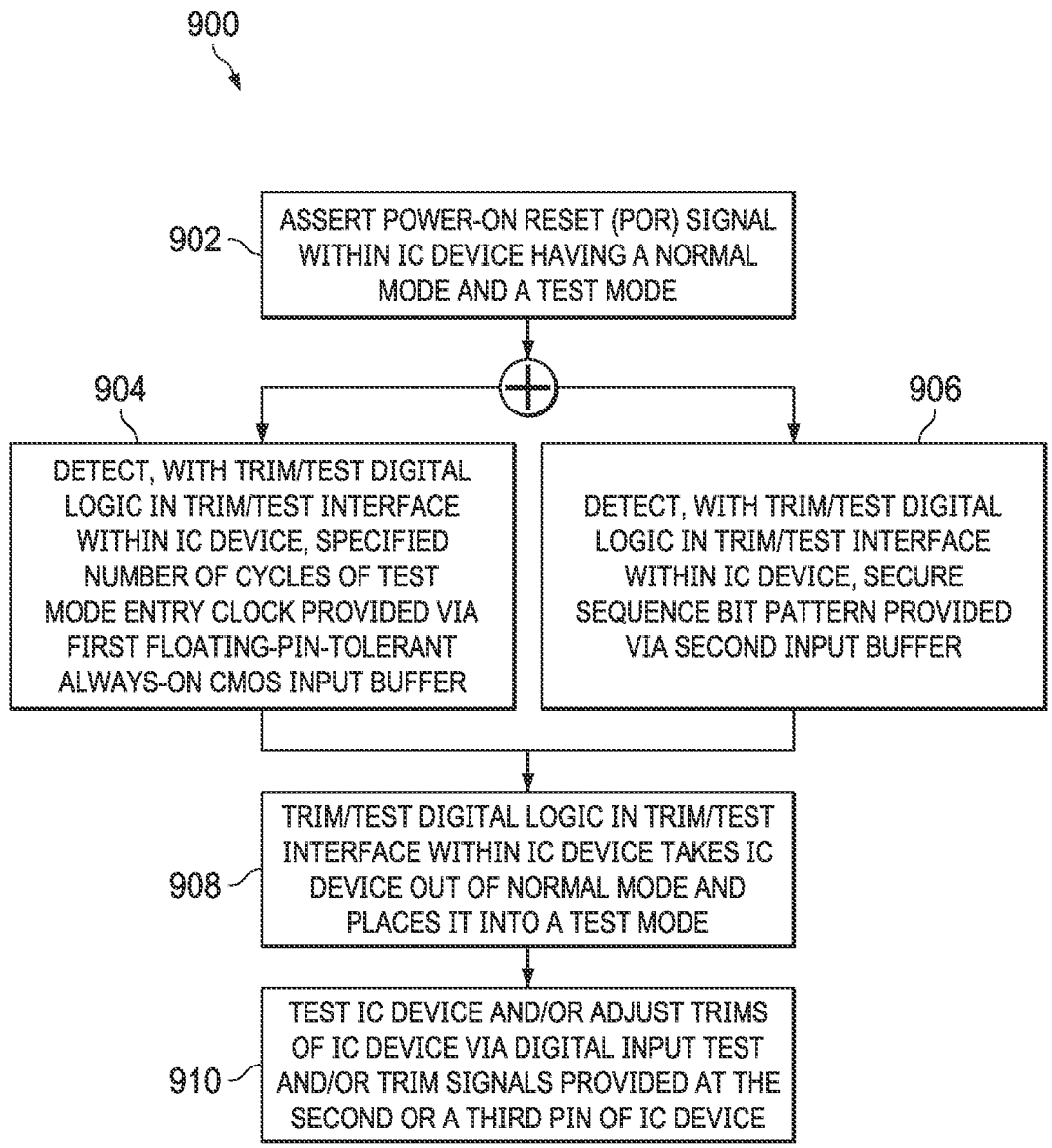
FIG. 9 is a flow chart showing an example method of test mode enabling in an IC device with low pin count or analog or no-connect pins.

The flow chart of FIG. 9 shows an example method 900 of test mode enablement in an IC device, e.g., in an IC device having a low pin count (e.g., six pins or fewer) or an IC device that provides only analog or no-connect pins for test mode entry inputs (inputs upon which entry into test mode is conditioned), such as IC device 100 or 102 of FIG. 1A or 1B or IC device 202, 702, or 802 of FIG. 2, 7, or 8. The IC device has a normal mode and a test mode, of which the test mode can only be entered into by providing entry keys via the test mode entry inputs. A power-on reset signal is asserted 902 within the IC device. This power-on reset signal can be as shown in plot 604 of timing diagram of FIG. 6. Trim/test digital logic in a trim/test interface within the IC device detects 904 a specified number of cycles of a test mode entry clock provided via a first floating-pin-tolerant always-on CMOS input buffer. The digital logic can be, for example, digital logic 208 in FIG. 2. The first input buffer can be, for example, always-on buffer 204 in FIG. 2, implemented as a first instance of buffer 300, 400, or 500 of FIG. 3, 4, or 5. The test mode entry clock can be a digital signal provided on a first pin of the IC device that can be configured, for example, to receive an analog input signal in a normal mode of operation of the IC device.

The digital logic further detects 906 a secure sequence bit pattern provided via a second input buffer. The second input buffer can be, in some examples, always-on buffer 206 in FIG. 2, implemented as a second instance of floating-pin-tolerant always-on CMOS input buffer 300, 400, or 500 of FIG. 3, 4, or 5. In other examples, the second input buffer can be a gated buffer, such as gated buffer 710 or 810 in FIG. 7 or 8. The secure sequence bit pattern can be a digital signal provided on a second pin of the IC device that can be configured, for example, as a no-connect pin in a normal mode of operation of the IC device.

In some examples, detection 904 and detection 906 can happen in any order with respect to one another. In other examples, detection 906 happens only after detection 904. Both detections 904, 906 having been accomplished, the digital logic takes the IC device out of a normal mode of operation and places 908 the IC device into a test mode of operation in which the IC device is configured to be tested 910 and/or in which trims of the IC device are configured to be adjusted 910. In some examples, e.g., as shown in FIG. 2, the IC device is tested 910 and/or the trims of the IC device are adjusted 910 via digital input test and/or trim signals provided at a third pin of the IC device, which pin can be configured, for example, as a failsafe digital output in the normal mode of the IC device. In some other examples, e.g., as shown in FIGS. 7 and 8, the IC device is tested 910 and/or the trims of the IC device are adjusted 910 via digital input test and/or trim signals provided at the second pin of the IC device, which pin can be configured, for example, as a failsafe digital output in the normal mode of the IC device.

The example trim/test interfaces and the example trim/test methods of the present application provide for false-entry-free test mode activation for IC devices with a low pin count, where there are a limited number of pins to cover all test/trim functions, or in which only analog, no-connect, or failsafe pins are available for trim or test mode entry control or trim or test data input, by using a floating-pin-tolerant, always-on CMOS input buffer with a slew rate-based test/trim interface. The use of through-current blocking and floating input tolerant CMOS input buffers in the example trim/test interfaces and methods can implement number-of-clock-cycles-based and bit-pattern-based test mode entry keys that can be provided on analog or no-connect pins to enter test mode. The described input buffer has an input that is high-impedance at DC. Irrespective of input pad voltage state, the buffer input is guaranteed to be at the potential of the voltage rails (GND or VDD). The described input buffer has a high noise margin and no through-current for floating or intermediate input voltage. The example trim/test interfaces described in this application provide an operationally robust design that avoids false entry into test mode. They further allow analog, no-connect and fail-safe pin operation in normal mode for pins designated to provide test entry control signals and other trim/test mode signals.

The interfaces and methods of the present application can be contrasted with "voltage key"-based trim methods, in which a pin designated as a test mode enable pin is taken higher than the supply voltage VDD to enter test mode, and an integer number N of clock cycles are given as input. In voltage key-based methods, the expectation is that, in normal operation, the voltage at the test mode enable pin is always less than or equal to the supply voltage VDD, so that test mode is not enabled by mistake, and there is no current drawn from the test mode pin in normal operation. However, such voltage key-based methods pose difficulties of implementation when the one or more pins available for designation as test mode entry control pins are either sense or reset pins that may have an independent rating with respect to the supply voltage VDD, and can in practice have voltages that are higher than the supply voltage VDD in normal operation. Voltage key-based methods thus have the disadvantages that, in normal operation, the pin designated for test mode entry control cannot go higher than the supply voltage VDD, this test mode entry control pin may draw current in normal operation, and there may be short-circuited current for floating or intermediate input voltage at this test mode entry control pin.

In contrast to trim/test interfaces that require the pin designated as the test mode entry control pin to be a digital input pin, and that require the pin designated as the test mode entry control pin not to be an analog pin or a no-connect (floating) pin, the interfaces and methods of the present application thus permit for implementation of post-package trim/test capability for devices with a low pin count (e.g., 6 pins or less) without constraining the pin operation in normal (non-trim/test) mode. Whereas use of an analog pin or a no-connect pin as a test mode entry control pin can cause false entry into test mode, or can cause a high through-current in input buffers for test mode, the interfaces and methods of the present application can completely preclude false entry into test mode under practical operation conditions, without causing high through-current in input buffers during or when entering test mode. For example, the interfaces and methods of the present application do not require the voltage at the pin designated as the test mode entry control pin not go higher than the chip supply (non-failsafe) voltage, which occurrence could cause a false entry into test mode in voltage key-based methods. The interfaces and methods of the present application work to provide reliable test mode entry control, without the potential for high through-current power waste or circuit component damage, even for IC devices where the pins available for test mode entry control are analog, no-connect and/or failsafe (e.g., open-drain output).

The interfaces and methods of the present application may be implemented in IC devices having any number of pins, even IC devices having greater than six pins or greater than eight pins, and will still provide advantages and benefits where none of the pins assignable as test mode input or output pins is digital in nature. In the context of a trim/test mode interface, a standard CMOS buffer cannot work to accept at least a first test mode entry key signal from an analog pin or a no-connect pin, without risking false entry into test mode, and/or without incurring the disadvantages of high through-current through the buffer under circumstances in which the external voltage at the pin providing the first test mode entry key signal, on one side of the buffer, is different than the voltage internal to the trim/test mode interface on the other side of the buffer.

In this description, the term "based on" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. Modifications are possible in the described embodiments, and other embodiments are possible, within the scope of the claims.

What is claimed is:

1. An integrated circuit (IC) device comprising:
a first terminal of one or more terminals of the IC configured to receive a first signal associated with a first mode and a second signal associated with a second mode, wherein the second mode configures the IC device into a test mode configured to receive test inputs on the one or more terminals of the IC and to provide test outputs on the one or more terminals of the IC; and
a test interface including:
a logic circuit configured to transition the IC device from the first mode to the second mode; and
an always-on complementary metal-oxide-semiconductor (CMOS) input buffer coupled at a first end to the first terminal and at a second end to an input of the logic circuit.

2. The IC device of claim 1, wherein the always-on CMOS input buffer comprises:

a coupling capacitor coupled at a first end to an input of the always-on CMOS input buffer and at a second end to a first end of a feed-forward path of the always-on CMOS input buffer;
a feedback path coupled at a first end to a second end of the feed-forward path of the always-on CMOS input buffer and at a second end to the second end of the coupling capacitor, the feedback path comprising a feedback impedance; and
a logic gate coupled at a first input of the logic gate to the second end of the feed-forward path, at a second input of the logic gate to a POR output of a POR generator, and at an output of the logic gate to the second end of the always-on CMOS input buffer.

3. The IC device of claim 2, wherein the feed-forward path comprises:
in series with each other, a Schmitt inverter and a feed-forward inverter;
a pull-down initialization n-type metal-oxide semiconductor (NMOS) field effect transistor (FET) having a gate coupled to a logical complement of the POR output of the POR generator, a source coupled to a circuit ground of the IC device, and a drain coupled to the second end of the coupling capacitor; and
a pull-up initialization p-type metal-oxide-semiconductor (PMOS) FET having a gate coupled to the POR output of the POR generator, a source coupled to a positive supply rail of the IC device, and a drain coupled to an output of the Schmitt inverter and an input of the feed-forward inverter.

4. The IC device of claim 2, wherein the feed-forward path comprises, in series with each other, a Schmitt inverter and a NAND gate, a first input of the NAND gate coupled to an output of the Schmitt inverter, a second input of the NAND gate coupled to the POR output of the POR generator.

5. The IC device of claim 2, wherein the feedback path further comprises either:
a single noninverting feedback buffer; or
a first feedback inverter and a second feedback inverter in series with each other.

6. The IC device of claim 1, wherein the IC device has six or fewer terminals.

7. The IC device of claim 1, wherein the second mode configures a digital test mode entry clock signal as a key to entry of the IC device into the test mode.

8. A method comprising:
receiving, by an integrated circuit (IC) device, a power-on reset signal;
receiving, at a first input buffer of the IC device, a specified number of cycles of a test mode entry clock, wherein the first input buffer is an always-on complementary metal-oxide-semiconductor (CMOS) input buffer;
receiving, at a second input buffer of the IC device, a secure sequence bit pattern; and
in response to receiving the secure sequence bit pattern, entering, by the IC device, a test mode, wherein the test mode configures the IC device to be tested and/or adjusted.

9. The method of claim 8, wherein the IC device is packaged with six conductive terminals or fewer.

10. The method of claim 8, wherein the second input buffer is a second always-on CMOS input buffer.

11. The method of claim 8, wherein:
the test mode entry clock is a digital signal received on a first terminal of the IC device; and the first terminal of the IC device is configured to receive an analog input signal in a normal mode of operation of the IC device.

12. The method of claim 11, wherein the secure sequence bit pattern is a second digital signal provided on a second terminal of the IC device that is configured as a no-connect terminal in the normal mode.

13. The method of claim 12, wherein the IC device is configured to be tested and/or trims of the IC device are configured to be adjusted via digital input test and/or trim signals provided at a third terminal of the IC device that is configured as a failsafe digital output in the normal mode.

14. The method of claim 11, wherein:
the secure sequence bit pattern is a second digital signal provided on a second terminal of the IC device; and
that the second terminal is configured as a failsafe digital output terminal in the normal mode.

15. The method of claim 14, wherein the IC device is configured to be tested and/or trims of the IC device are configured to be adjusted via digital input test and/or trim signals provided at the second terminal of the IC device.

16. An integrated circuit (IC) device comprising:
a first terminal configured to receive a first input in a first mode of the IC device and to receive a test signal for a second mode of the IC device;
a second terminal configured to provide a first output in the first mode and to receive and provide test input and output signals in the second mode; and
a complementary metal-oxide-semiconductor (CMOS) input buffer coupled at a first end to the first terminal, the CMOS input buffer including:
  a coupling capacitor coupled to a feed-forward path of the CMOS input buffer;
  a feedback path coupled to the feed-forward path of the CMOS input buffer and to the coupling capacitor; and
  a logic gate coupled to:
    the feed-forward path;
    a power-on reset (POR) output of a POR generator; and
    the CMOS input buffer.

17. The IC device of claim 16, wherein the CMOS input buffer is a first floating-pin-tolerant always-on CMOS input buffer, the IC device further comprising:
a third terminal configured as a first no-connect terminal in the first mode of the IC device and configured to receive a digital test mode secure sequence signal as a second key to enter the second mode of the IC device;
a fourth terminal configured as a second no-connect terminal in the first mode and configured to receive a digital test mode clock signal in the second mode;
a second floating-pin-tolerant always-on CMOS input buffer coupled at a first end to the third terminal, the second floating-pin-tolerant always-on CMOS input buffer including:
  a second coupling capacitor coupled to the second floating-pin-tolerant always-on CMOS input buffer and to a second feed-forward path of the second floating-pin-tolerant always-on CMOS input buffer;
  a second feedback path coupled to the second feed-forward path of the second floating-pin-tolerant always-on CMOS input buffer and to the second coupling capacitor; and
  a second logic gate coupled to:
    the second feed-forward path;
    to the POR output of the POR generator; and
    the second floating-pin-tolerant always-on CMOS input buffer;
a first gated buffer coupled at an input to the second terminal;
a second gated buffer coupled at an input to the third terminal; and
a third gated buffer coupled at an input to the fourth terminal, wherein the first, second, and third gated buffers are enabled to pass signals by a test mode enable signal.

18. The IC device of claim 16, wherein:
the second terminal is further configured to:
  receive a digital test mode secure sequence signal as a second key; and
  enter the test mode of the IC device;
the first terminal is configured to receive a digital test mode clock signal in the test mode;
the IC device further comprises:
  a first gated buffer coupled at an input to the second terminal; and
  a second gated buffer coupled at an output to the second terminal;
the first and second gated buffers are enabled to pass signals by a test mode enable signal; and
the test mode enable signal is based on the test signal being received as a first key.

19. The IC device of claim 16, wherein:
the second terminal is further configured to:
  receive a digital test mode secure sequence signal as a second key; and
  enter the test mode of the IC device;
the first terminal is further configured to receive a digital test mode clock signal in the test mode;
the IC device further comprises:
  a first gated buffer coupled at an input to the second terminal; and
  a second gated buffer coupled at an output to the second terminal;
the first gated buffer is enabled to pass signals by a first test mode;
the second gated buffer is enabled to pass signals by a second test mode enable signal; and
the first test mode enable signal based on the test signal being received as a first key, and to assert the second test mode enable signal based on the digital test mode secure sequence signal being received as the second key.

20. The IC device of claim 16, wherein the IC device comprises four or more terminals including the first and second terminals, and none of the four or more terminals are digital-only input terminals configured to receive the test signal as a first key.

* * * * *